(12) United States Patent
Nakayama

(10) Patent No.: US 6,958,532 B1
(45) Date of Patent: Oct. 25, 2005

(54) SEMICONDUCTOR STORAGE DEVICE

(75) Inventor: Sadao Nakayama, Tokyo (JP)

(73) Assignee: NEC Electronics Corporation, (JP)

( * ) Notice: Subject to any disclaimer, the term of this patent is extended or adjusted under 35 U.S.C. 154(b) by 97 days.

(21) Appl. No.: 09/593,891

(22) Filed: Jun. 14, 2000

(30) Foreign Application Priority Data

Jun. 18, 1999 (JP) ................................. 11-172387

(51) Int. Cl.[7] ............................................ H01L 23/02
(52) U.S. Cl. ..................... 257/686; 257/777; 257/778; 257/692; 257/780; 257/723; 438/108; 438/109; 361/760
(58) Field of Search ................................ 257/777, 778, 257/780, 730, 725, 723, 686, 692; 438/108, 438/109; 361/760; 258/686

(56) References Cited

U.S. PATENT DOCUMENTS

| | | | |
|---|---|---|---|
| 5,012,323 A * | 4/1991 | Farnworth | 257/723 |
| 5,347,159 A * | 9/1994 | Khandros et al. | 257/692 |
| 5,347,428 A * | 9/1994 | Carson et al. | 361/760 |
| 5,422,435 A * | 6/1995 | Takiar et al. | 174/52.4 |
| 5,495,398 A * | 2/1996 | Takiar et al. | 361/790 |
| 5,767,570 A * | 6/1998 | Rostoker | 257/668 |
| 5,903,049 A * | 5/1999 | Mori | 257/686 |
| 5,905,639 A * | 5/1999 | Warren | 361/776 |
| 5,976,911 A * | 11/1999 | Bruce et al. | 438/107 |
| 6,133,637 A * | 10/2000 | Hikita et al. | 257/777 |

FOREIGN PATENT DOCUMENTS

| | | | |
|---|---|---|---|
| JP | 60-9238 | 1/1985 | ........... H01L 25/14 |
| JP | 04-007867 | 1/1992 | ......... H01L 25/065 |
| JP | 5-121643 | 5/1993 | ........... H01L 25/00 |
| JP | 05198735 A * | 8/1993 | |

\* cited by examiner

Primary Examiner—George Eckert
Assistant Examiner—Chris C. Chu
(74) Attorney, Agent, or Firm—Hayes Soloway P.C.

(57) ABSTRACT

A semiconductor storage device enables various plural memories to be mounted on the same package, and even though size of respective chips and/or position of bonding pad are different, it is capable of providing a stack MCP in which the chips are superimposed. It causes wiring sheet to intervene between an upper chip and a lower chip. There are provided bonding pads and a wiring pattern for connecting these bonding pads in the wiring sheet. A bonding pad of the upper chip is connected to the bonding pad by a first bonding wire, while the bonding pad is connected to a bonding pad of the package substrate by a second bonding wire. According to this construction, the signal from the upper chip is transmitted to the package substrate via the wiring sheet.

7 Claims, 2 Drawing Sheets

SEMICONDUCTOR STORAGE DEVICE

BACKGROUND OF THE INVENTION

The present invention relates to a semiconductor storage device. More particularly, this invention relates to wiring structure of the semiconductor storage device according to stack type MCP (Multi Chip Package) of superimposing a plurality of chips.

DESCRIPTION OF THE PRIOR ART

Formerly, a stack MCP package is formed in such a way that a plurality of chips are superimposed. Namely, a stack MCP consists of the package in which a plurality of chips are superimposed. In a stack MCP, generally, a bonding pad of respective chips is arranged in a place near by, with the same arrangement. Further, it is necessary that respective chip sizes are of optimum size. In recent years, it is required a combination of memory with various capacities.

In order to meet this requirement, for instance, Japanese Patent Application Laid-Open No. HEI 5-121643 discloses a bonding method. Such bonding method is that bonding is performed at the position where bonding pad position of the chip side is shifted largely.

FIG. 1 is a view showing a conventional stack MCP.

In FIG. 1, a package substrate 1, a lower chip 2, and an upper chip 3 are placed one upon another while being shifted from the lowest layer. A bonding pad 4 of the upper chip 3 is connected to a bonding pad 5 of the package substrate 1 by a bonding wire 6. A bonding pad 7 of the lower chip 2 is connected to a bonding pad 5 of the package substrate 3 by a bonding wire 8.

As described above, in a conventional stack MCP, the bonding wire 6 from the upper chip 3 is connected directly to the package substrate 1 exceeding the lower chip 2, therefore, extremely long bonding wire 6 is necessary. For that reason, the bonding wire 6 deviates from prescribed position on the occasion of confining the bonding wire in resin, thus there is the problem of breaking a wire or of contact with another wire.

Further, there is the problem that thickness of the package is forced to be increased because the bonding wire increases in the height direction for the sake of wire bonding of long distance.

SUMMARY OF THE INVENTION

In view of the foregoing, it is an object of the present invention, in order to overcome the above-mentioned problem to provide a semiconductor storage device which enables various plural memories to be mounted on the same package, further in the case where even though scale of respective chips and/or position of the bonding pad are different, it is capable of providing a stack MCP in which the chips are superimposed.

According to a first aspect of the present invention, in order to achieve the above-mentioned object, there is provided a semiconductor storage device constituted in such a way that a lower chip and an upper chip are superimposed on a substrate, which comprises a wiring substrate for relaying electric connection between the upper chip and the substrate which wiring substrate is provided between the lower chip and the upper chip.

According to a second aspect of the present invention, in the first aspect, there is provided a semiconductor storage device, wherein there are provided a first terminal connected to a terminal on a surface of the upper chip, a second terminal connected to a terminal on a surface of the substrate, and a wiring pattern for connecting the first and the second terminals on the surface of the wiring substrate.

According to a third aspect of the present invention, in the second aspect, there is provided a semiconductor storage device, which further comprises a first bonding wire for connecting the terminal of the surface of the upper chip with the first terminal, and a second bonding wire for connecting the terminal of the surface of the substrate with the second terminal.

According to a fourth aspect of the present invention, in the first aspect, there is provided a semiconductor storage device, wherein there is provided a wiring pattern whose one end is connected to a terminal on a rear surface of the upper chip, and whose other terminal is connected to a terminal on a surface of the lower chip.

According to a fifth aspect of the present invention, in the second or the fourth aspect, there is provided a semiconductor storage device, wherein the terminal of the surface of the lower chip is connected to the terminal of the surface of the substrate by a third bonding wire.

According to a sixth aspect of the present invention, in the first aspect, there is provided a semiconductor storage device, wherein the wiring substrate is a sheet wiring substrate.

According to a seventh aspect of the present invention, in the first aspect, there is provided a semiconductor storage device, wherein the wiring substrate is a board wiring substrate.

The above and further objects and novel features of the invention will be more fully understood from the following detailed description when the same is read in connection with accompanying drawings. It should be expressly understood, however, that the drawings are for purpose of illustration only and are not intended as a definition of the limit of the invention.

DETAILED DESCRIPTION OF THE PREFERRED EMBODIMENT

A preferred embodiment of the present invention will be described in detail in accordance with the accompanying drawings.

Figure 1:
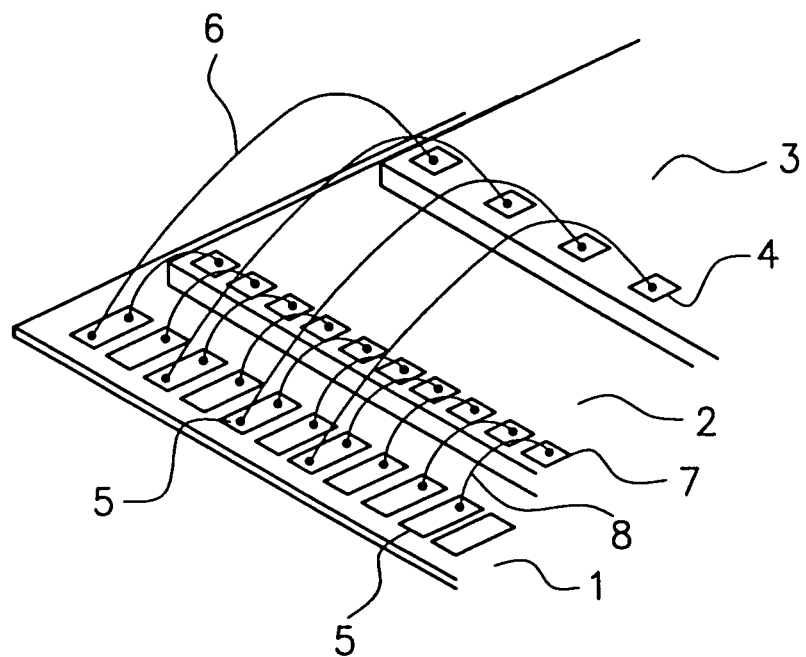
FIG. 1 is a perspective view showing a conventional stack MCP.
Figure 2:
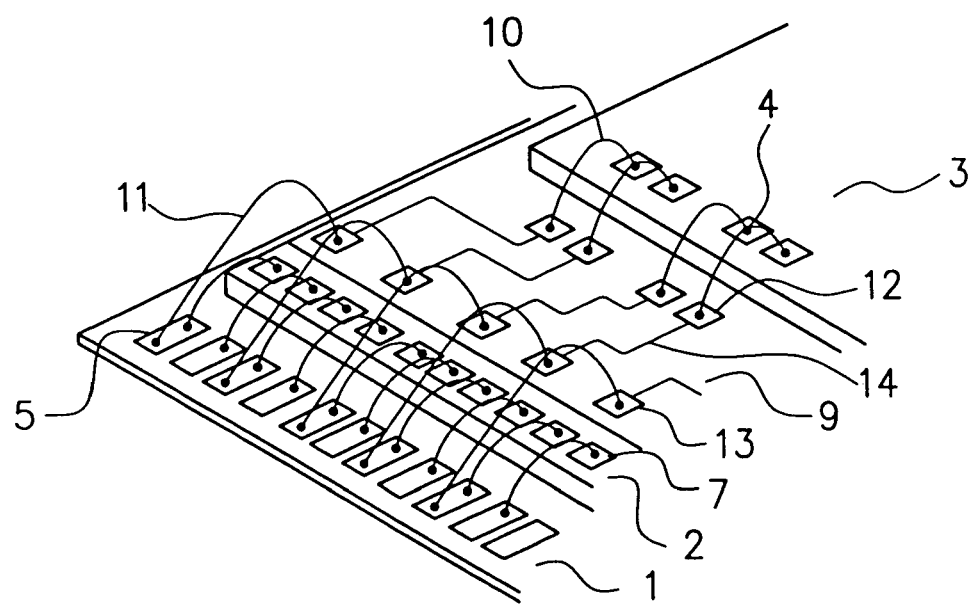
FIG. 2 is a perspective view showing a first embodiment of the present invention.

FIG. 2 shows construction of a stack MCP (Multi Chip Package) according to the first embodiment of the present invention. The present embodiment, as illustrated, is characterized in that, in the stack type MCP, a wiring sheet 9 intervenes between an upper chip 3 and lower chip 2, thus the bonding wires 10, 11 are connected from the upper chip 3 to the package substrate 1 via the wiring sheet 9.

Namely, in FIG. 2, there is provided the wiring sheet 9 between the upper chip 3 and the lower chip 2. There are provided a first bonding pad 12 and a second bonding pad 13 on the wiring sheet 9. Further, there is provided a wiring pattern 14 for connecting these bonding pads 12, 13. Furthermore, the bonding pad 4 of the upper chip 3 is connected to the above-described bonding pad 12 by the first bonding wire 10. Moreover, the second bonding pad 13 is connected to the bonding pad 5 of the package substrate 1 by the bonding wire 11.

According to the above construction, the signal from the upper chip 3 is transmitted to the package substrate 1 via the wiring sheet 9. Namely, the signal from the upper chip 3 is transmitted to the bonding pad 4, the bonding wire 10, the bonding pad 12, the wiring pattern 14, the bonding pad 13, the bonding wire 11, and the bonding pad 5. Oppositely, transmission of the signal from the package substrate 1 to the upper chip is implemented in the opposite order to the order described above.

Consequently, according to the present embodiment, in the case where a differential of chip size is large between the upper chip 3 and the lower chip 2, wire length does not become long, thus it is capable of avoiding the problem concerning the package combination such as wire deviation and so forth described above. Further, in large number of cases, the stack MCP shares the signal both of the upper chip 3 and the lower chip 2, combination between chips whose arrangement of the bonding pads becomes easy by employing the wiring substrate 9. Namely, due to the wiring pattern 14 on the wiring sheet 9, it is possible to locate the wire of the upper chip 3 adjacent periphery of the bonding pad 7 of the lower chip 2 through which the common signal flows.

Next, there will be described the second embodiment of the present invention. In the above-described first embodiment, the construction places the rear surface of the upper chip 3 on the surface of the wiring sheet 9. However, in the present embodiment, the upper chip 3 is placed on the wiring sheet 9 in such a way that chip surface is directed to the lower direction while causing inside and outside to be reversed, i.e., upside-down, before placing on the wiring sheet 9. Further, one end of the wiring pattern 14 of the wiring sheet 9 is connected directly to the bonding pad 4 of the upper chip 3, while the other end of the wiring pattern 14 is connected to the bonding pad 7 of the lower chip 2.

According to the above-described construction, the bonding pad 4 is connected directly to the wiring pattern 14 on the wiring sheet 9. Consequently, a bonding wire between the wiring sheet 9 and the upper chip 3 becomes unnecessary.

Figure 4:
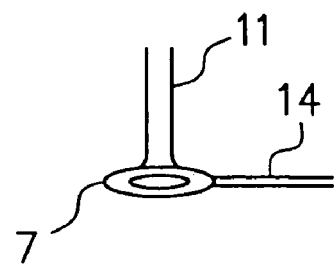
FIG. 4 is an enlarged fragmentary view of a single bonding pad of FIG. 3.

Further, by extending the wiring pattern on the wiring sheet 9 to run to the upper part of the bonding pad 7 of the lower chip 2, as shown in FIG. 4, it becomes possible to perform bonding both of the bonding pad 7 of the lower chip 2 and the wiring pattern 14 on the wiring sheet 9 to the bonding pad 5 of the package substrate 3 with one wire bonding step.

Figure 3:
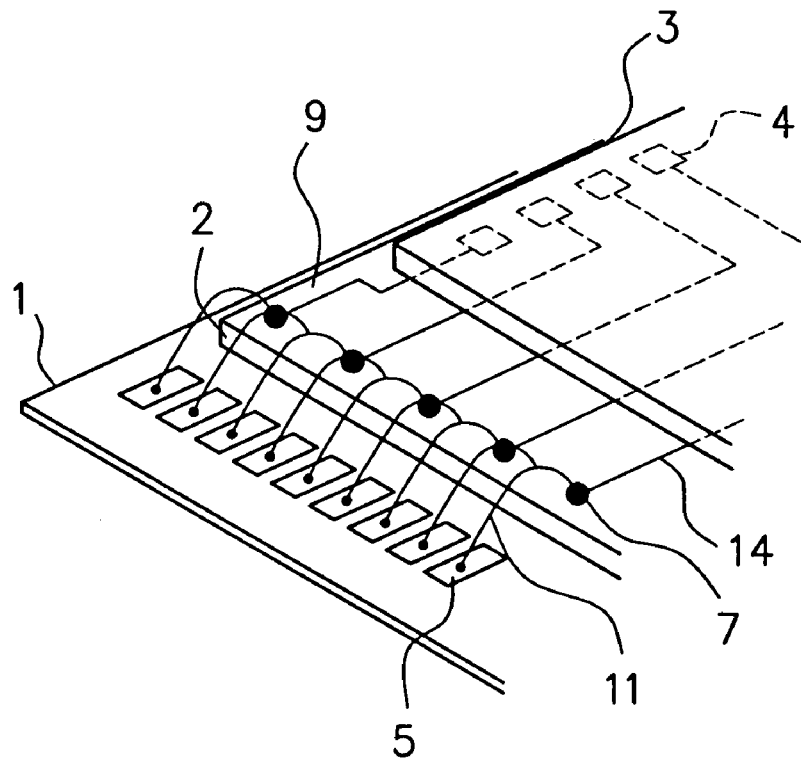
FIG. 3 is a perspective view showing a second embodiment of the present invention.

As described above, according to the present embodiment, it becomes possible to eliminate the wire bonding with respect to the wiring sheet 9 from the upper chip 3, and to obtain a thinner package. As shown in FIG. 3, when the arrangement of the bonding pad 4 of the upper chip 3 is perpendicular to the arrangement of the wiring sheet 9, the lower chip 2, and respective bonding pad of the package substrate 1 in the horizontal direction, since it becomes possible to eliminate wiring bonding in the horizontal direction, it becomes possible to reduce the size of the package in the horizontal direction.

Further, in the above described first and the second embodiments, description is implemented with respect to wiring sheet as the wiring substrate, however, it is also suitable that the wiring substrate is of the board type.

As described above, according to the present invention, there is provided a wiring substrate such as the wiring sheet and so forth between the upper chip and the lower chip, thus causing electric connection to the package substrate from the upper chip to be implemented through the above described wiring substrate, therefore, even though the differential of chip size between the upper chip and the lower chip is large, it becomes possible to position the bonding pad to the ideal bonding position.

For that reason, it is capable of developing easily the stack MCP of chips of combination which it is impossible to assemble until now because the differential of the chip size is large.

Consequently, it is capable of mounting various plural memories on the same package, thus even though when scale of respective chips and/or the position of the bonding pad are different, it is capable of providing the stack MCP in which the chips are superimposed.

Further, in the cases where the upper chip and the lower chip are bonded to the same bonding pad on the package substrate, even though respective chip layouts are different and the bonding pads on the chip exist in the positions with long distance, it is possible to arrange the bonding pad by changing wiring on the wiring sheet to the ideal bonding position.

While preferred embodiments of the invention have been described using specific terms, the description has been for illustrative purposes only, and it is to be understood that changes and variations may be made without departing from the spirit or scope of the following claims.

What is claimed is:

1. A semiconductor device, comprising:
   a package substrate having a first pad;
   a first chip having a second pad and formed on said package substrate;
   a wiring substrate formed on said first chip, said wiring substrate having a third pad, a fourth pad and a wiring pattern connected between said third and fourth pads; and
   a second chip having a fifth pad and formed on said wiring substrate;
   a first bonding wire connecting said first pad and said third pad; and
   a second bonding wire connecting said fourth pad and said fifth pad.

2. The semiconductor device as claimed in claim 1, wherein no bonding wire connects said first pad and said fifth pad.

3. The device as claimed in claim 1, said device further comprising a third bonding wire connecting said first pad, wherein said third bonding wire and said first bonding wire are connected with the same first pad.

4. The device as claimed in claim 1, said device comprising:
   said package substrate having a plurality of said first pads;
   said first chip having a plurality of said second pads formed on said package substrate;
   said wiring substrate formed on said first chip having a plurality of said third pads, a plurality of said fourth pads and wiring patterns connected between said third and fourth pads; and
   said second chip having a plurality of said fifth formed on said wiring substrate.

5. The semiconductor device as claimed in claim 4, wherein one of said first pads is connected to one of said second pads as well as one of said third pads.

6. A stacked semiconductor storage device as claimed in claim 1, wherein said wiring substrate is a sheet wiring substrate.

7. A stacked semiconductor storage device as claimed in claim 1, wherein said wiring substrate is a board wiring substrate.

* * * * *